(12) United States Patent
Takaguchi et al.

(10) Patent No.: US 11,183,362 B2
(45) Date of Patent: Nov. 23, 2021

(54) CHARGED PARTICLE BEAM APPARATUS AND SAMPLE OBSERVATION METHOD USING THE SAME

(71) Applicant: Hitachi High-Tech Corporation, Tokyo (JP)

(72) Inventors: Katsura Takaguchi, Tokyo (JP); Natsuki Tsuno, Tokyo (JP); Masahiro Sasajima, Tokyo (JP); Toshihide Agemura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/765,737

(22) PCT Filed: Nov. 27, 2017

(86) PCT No.: PCT/JP2017/042340
§ 371 (c)(1),
(2) Date: May 20, 2020

(87) PCT Pub. No.: WO2019/102603
PCT Pub. Date: May 31, 2019

(65) Prior Publication Data
US 2020/0294764 A1   Sep. 17, 2020

(51) Int. Cl.
*H01J 37/28* (2006.01)
*H01J 37/22* (2006.01)
*H01J 37/285* (2006.01)

(52) U.S. Cl.
CPC .............. *H01J 37/28* (2013.01); *H01J 37/22* (2013.01); *H01J 37/285* (2013.01)

(58) Field of Classification Search
CPC .. H01J 37/00; H01J 37/02; H01J 37/22; H01J 37/226; H01J 37/228; H01J 37/26;
(Continued)

(56) References Cited

U.S. PATENT DOCUMENTS

| | | | |
|---|---|---|---|
| 4,929,041 A | * | 5/1990 | Vahala ............... H01J 37/228 250/227.23 |
| 5,111,043 A | | 5/1992 | Shigenaka et al. |

(Continued)

FOREIGN PATENT DOCUMENTS

| | | |
|---|---|---|
| JP | H04-212250 A | 8/1992 |
| JP | 2006-145526 A | 6/2006 |
| WO | 2015045498 A1 | 4/2015 |

OTHER PUBLICATIONS

Search Report dated Jan. 30, 2018 in International Application No. PCT/JP2017/042340.

*Primary Examiner* — Jason L McCormack
(74) *Attorney, Agent, or Firm* — Miles & Stockbridge, P.C.

(57) ABSTRACT

A charged particle beam apparatus includes: an electromagnetic wave generation source 16 that generates an electromagnetic wave with which a sample is irradiated; a charged particle optical system that includes a pulsing mechanism 3 and irradiates the sample with a focused charged particle beam; a detector 10 that detects an emitted electron emitted by an interaction between the charged particle beam and the sample; a first irradiation control unit 15 that controls the electromagnetic wave generation source and irradiates the sample with a pulsed electromagnetic wave to generate an excited carrier; a second irradiation control unit 14 that controls the pulsing mechanism and irradiates an electromagnetic wave irradiation region of the sample with a pulsed charged particle beam; and a timing control unit 13. While the emitted electrons are detected by the detector in synchronization with irradiation of the pulsed charged particle beam, the timing control unit controls the first irradiation control unit and the second irradiation control unit, and controls an interval time between the pulsed electromagnetic wave and the pulsed charged particle beam to the electro-
(Continued)

magnetic wave irradiation region. As a result, based on a transient change in an electron emission amount, it is possible to detect sample information with nano spatial resolution.

11 Claims, 9 Drawing Sheets

(58) Field of Classification Search
CPC ........ H01J 37/261; H01J 37/28; H01J 37/285; H01J 2237/24495; H01J 2237/2803; G01N 23/225
USPC .......................................... 250/306, 307, 311
See application file for complete search history.

(56) References Cited

U.S. PATENT DOCUMENTS

| | | |
|---|---|---|
| 2006/0098188 A1 | 5/2006 | Buijsse et al. |
| 2011/0204228 A1* | 8/2011 | Tsuno .................... H01J 37/224 250/310 |
| 2012/0037801 A1* | 2/2012 | Mochizuki ............. G01B 15/00 250/306 |
| 2016/0005566 A1* | 1/2016 | Zewail ............. G01N 23/20058 250/307 |
| 2016/0190020 A1* | 6/2016 | Kimura .................... H01L 22/12 438/16 |
| 2016/0240348 A1 | 8/2016 | Yokosuka et al. |
| 2017/0271123 A1* | 9/2017 | Talebi Sarvari ...... H01J 37/226 |

\* cited by examiner

[FIG. 1]
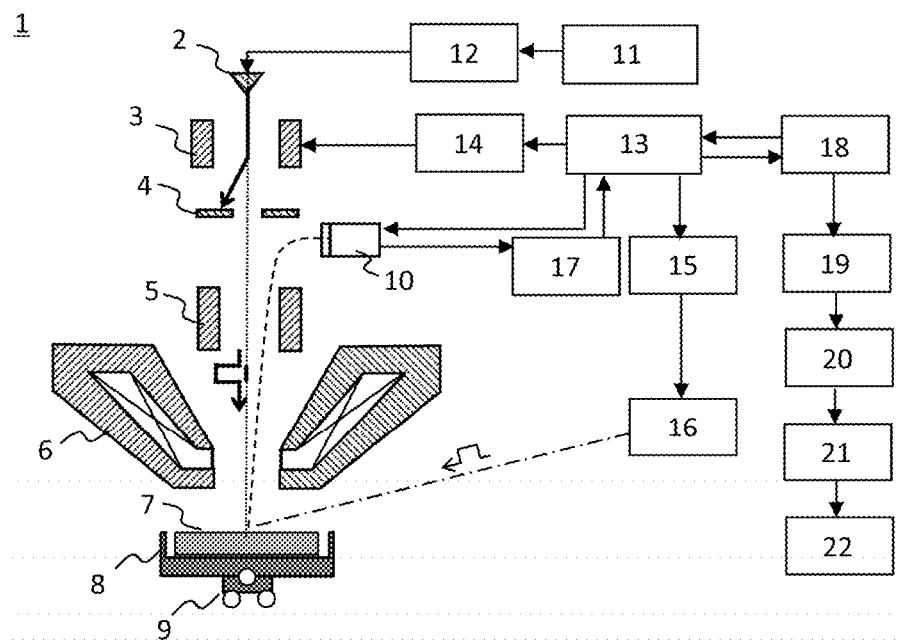
[FIG. 2]
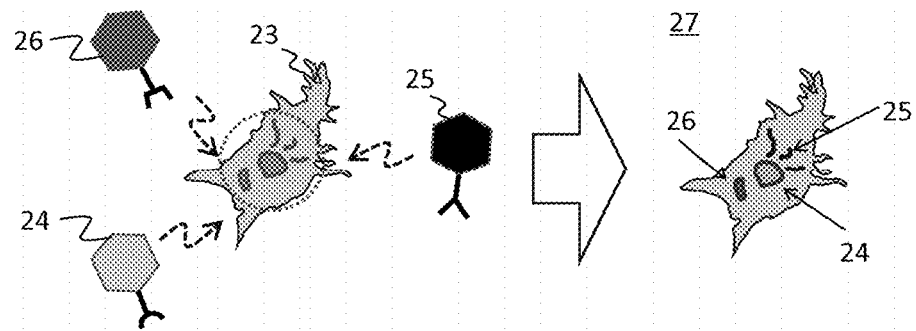

[FIG. 3]
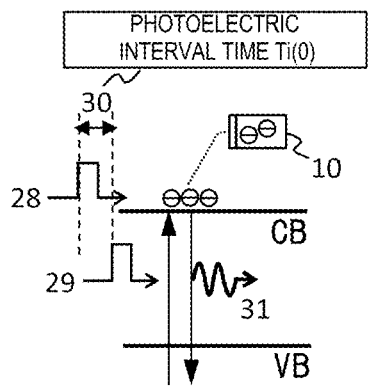
[FIG. 4]
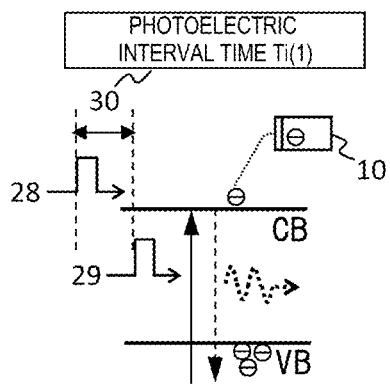
[FIG. 5]
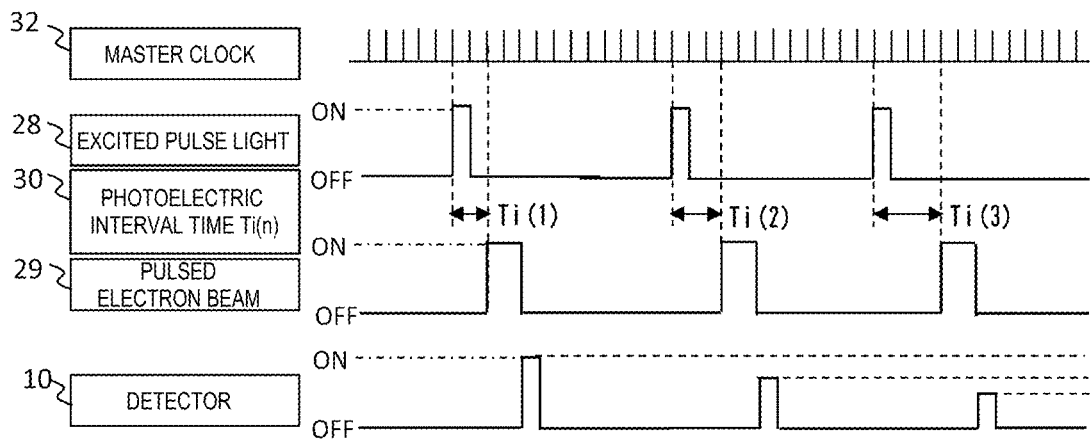

[FIG. 6]
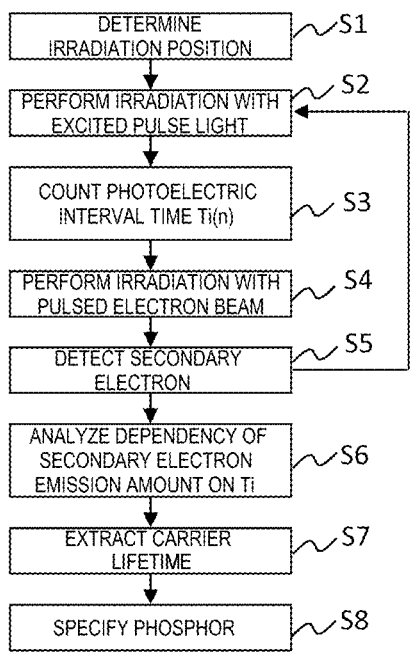
[FIG. 7]
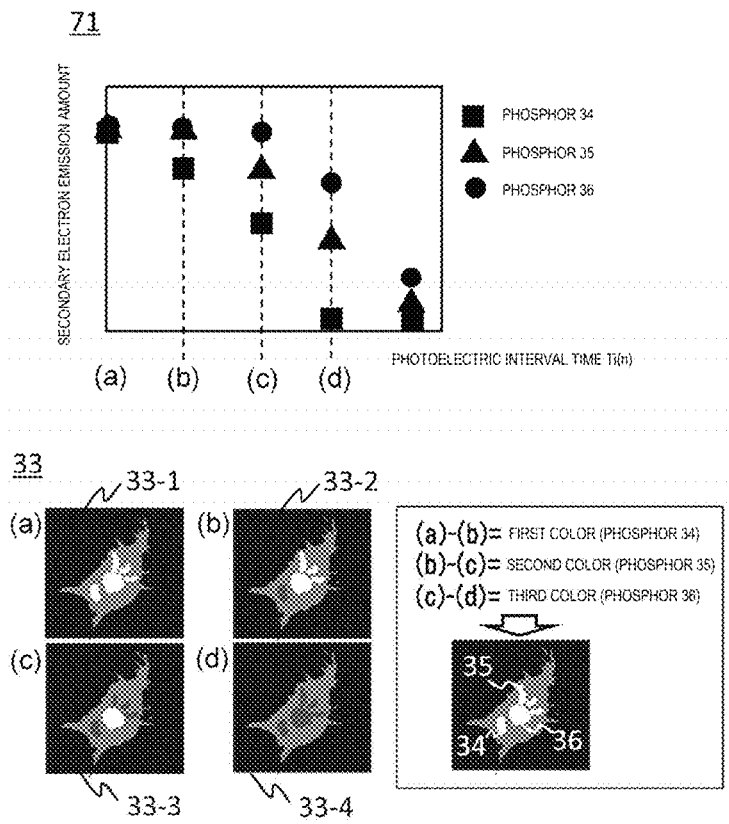

[FIG. 8]
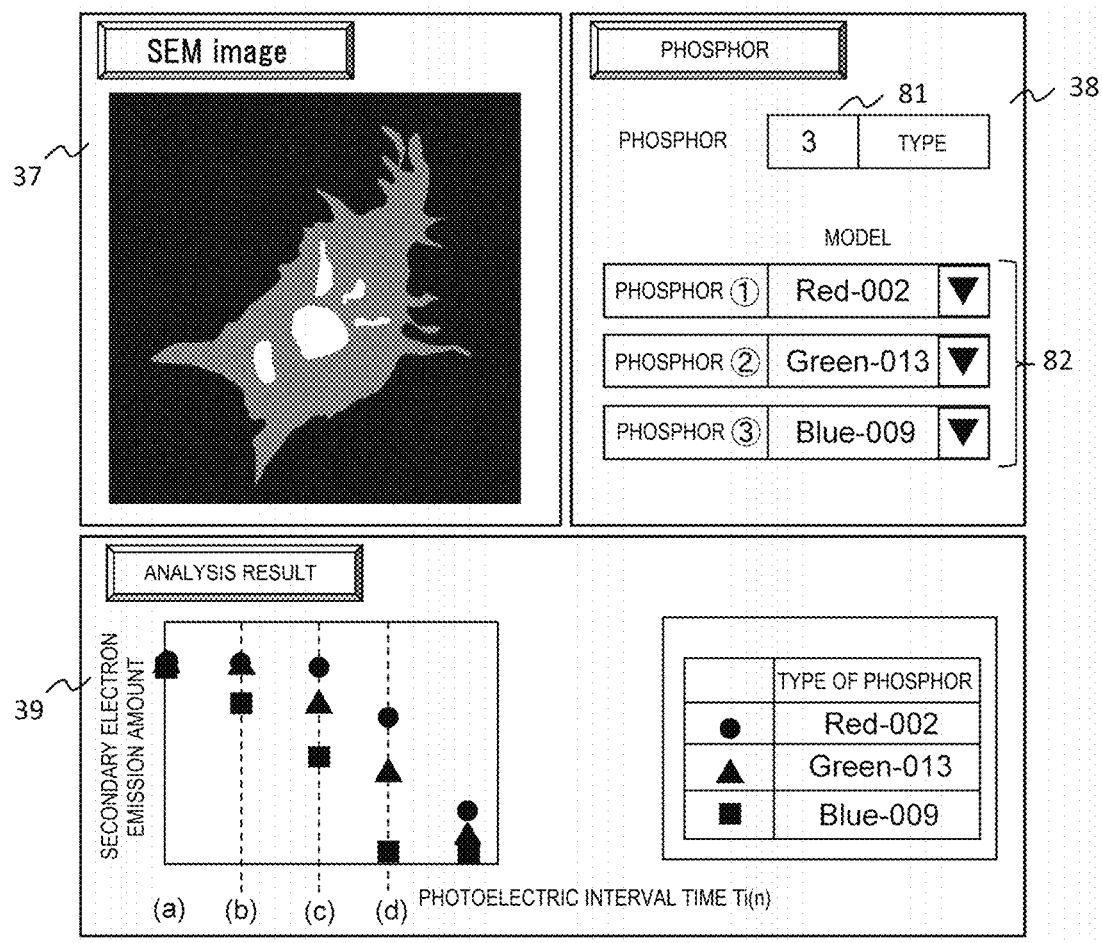

[FIG. 9]
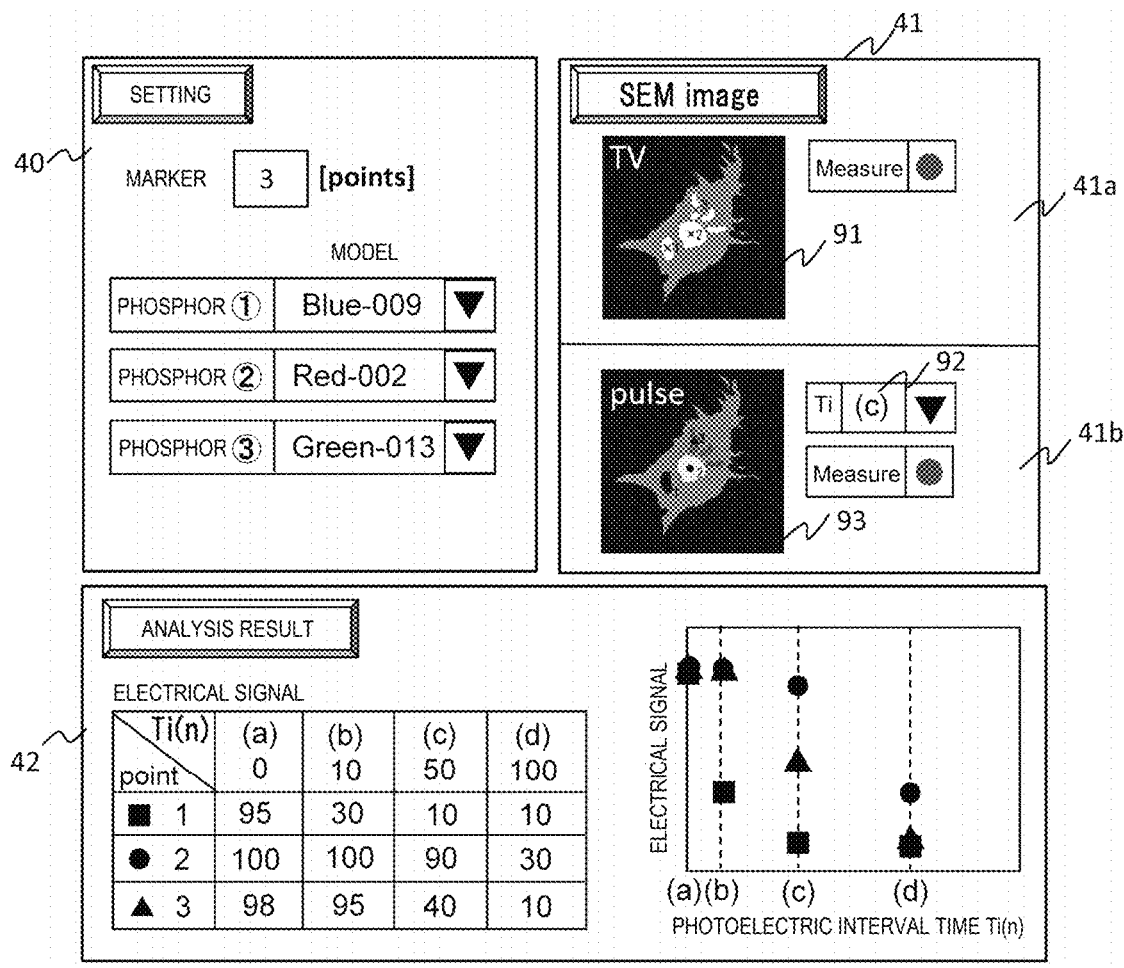

[FIG. 10]
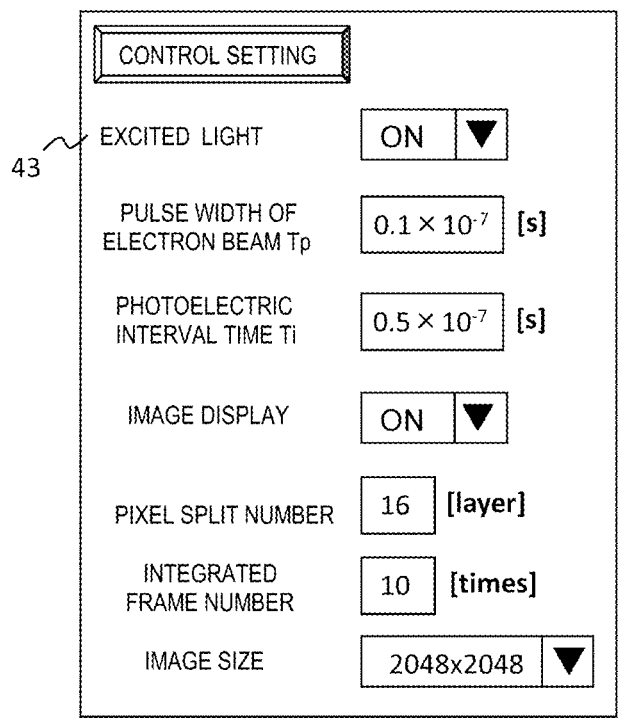

[FIG. 11A]
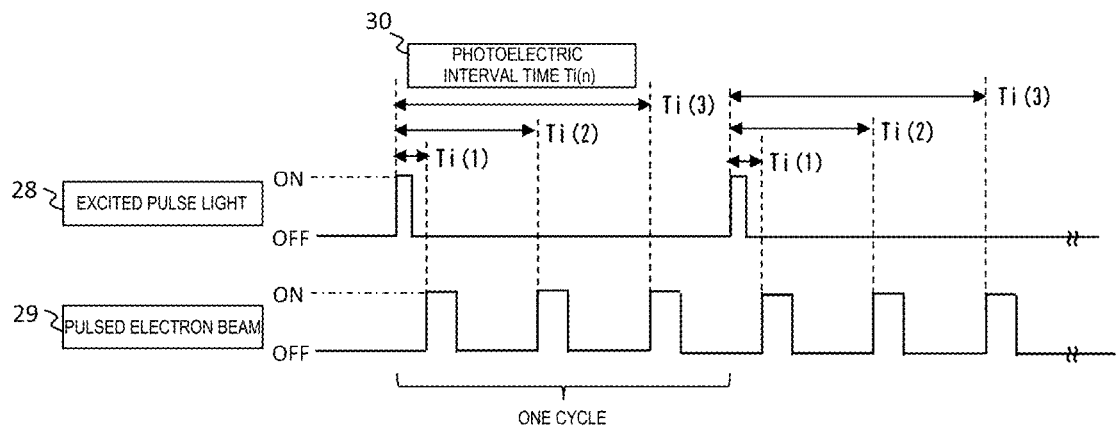
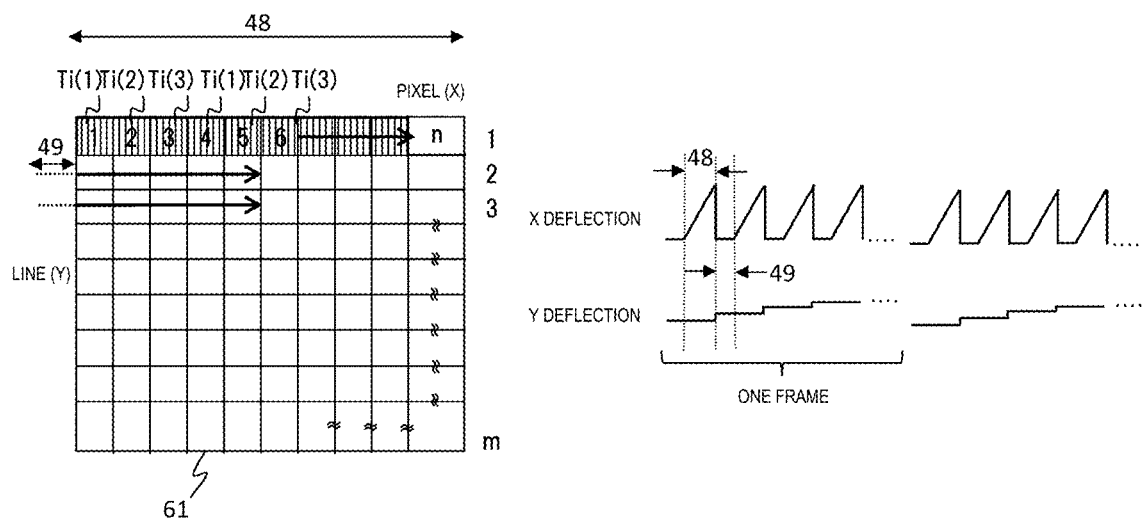
[FIG. 11B]
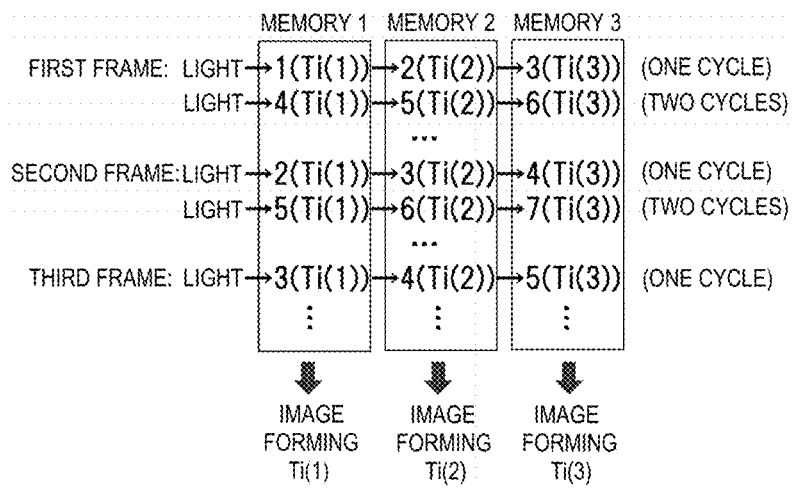

[FIG. 12]
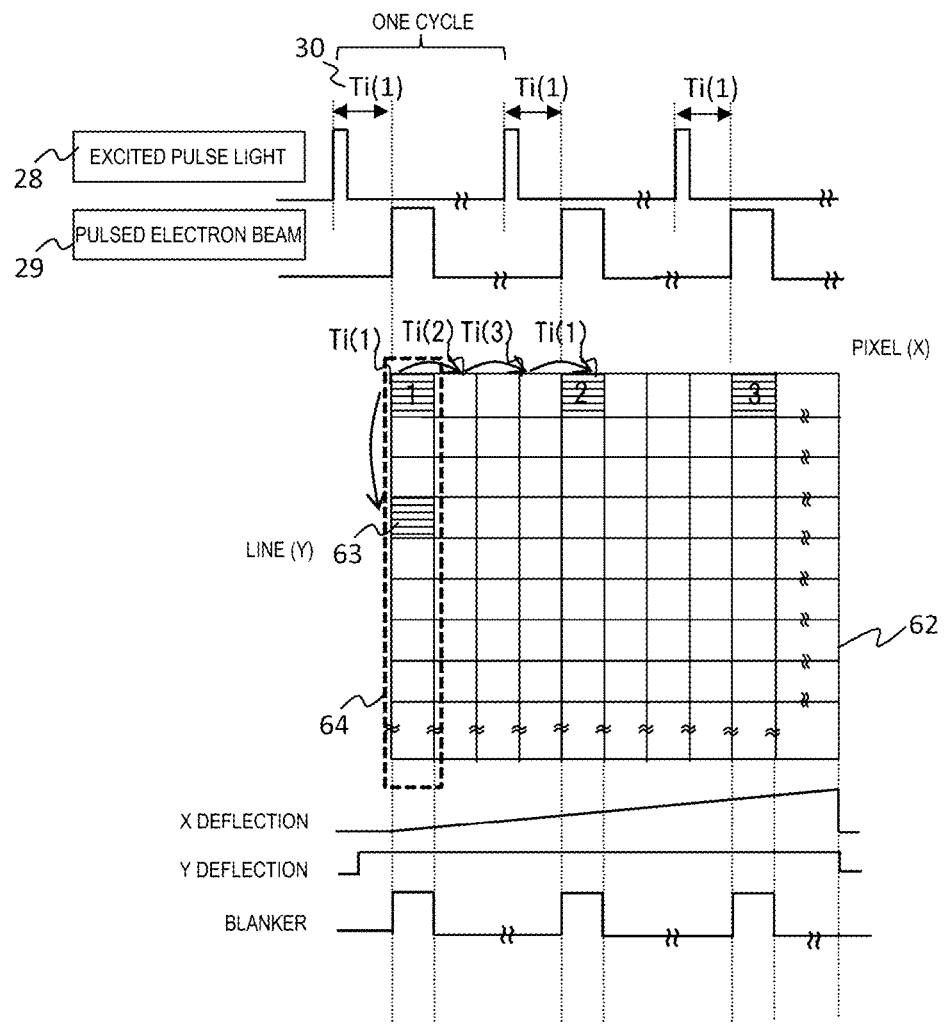

[FIG. 13]
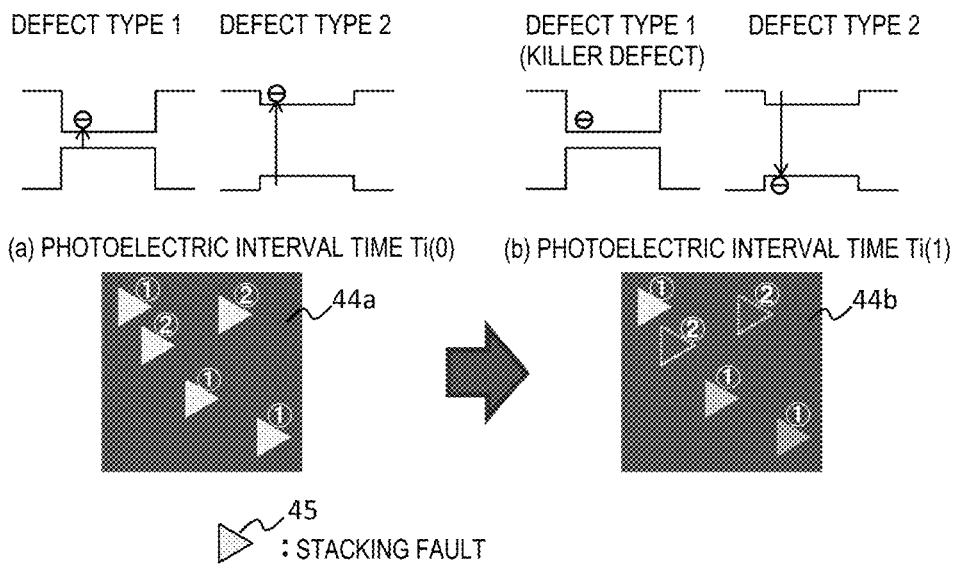
[FIG. 14]
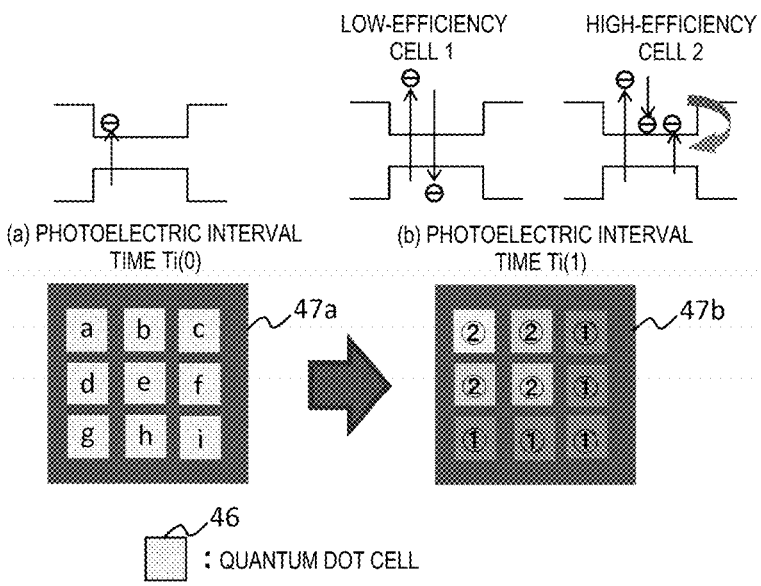

CHARGED PARTICLE BEAM APPARATUS AND SAMPLE OBSERVATION METHOD USING THE SAME

TECHNICAL FIELD

The present invention relates to a charged particle beam apparatus that combines an electron beam and an electromagnetic wave, and particularly to a technique for specifying a phosphor from a transient change in an electron emission amount.

BACKGROUND ART

An electron microscope that enables a magnified observation of a sample with high resolution is used as a means for visualizing a surface shape and composition information by a change in an amount of secondary electron emission due to scattering of electrons and substances. On the other hand, an optical microscope enables visualization of a surface, interface morphology and fluorescence by a change in light quantity and wavelength due to interference and energy conversion. The optical microscope is used as observation means in a sub-micro field, such as fluorescence observation for biotechnology utilizing characteristics of light and interface inspection for crystal defects. In recent years, with the deepening of nanotechnology, observation objects such as fluorescent viruses, threading dislocations of the crystal defects and quantum dots become nanoscale, and a need for nano information is increased. With a need for nano analysis, the electron microscope is expected to be applied to a wider range of applications, such as in fields of medicine and biology, as well as in the field of semiconductors. For example, there is a cathodoluminescence (CL) method for observing a sample stained with a phosphor known in the field of biology. This is a technique of detecting fluorescence generated when a fluorescence-stained sample is irradiated with an electron beam, and comparing the fluorescence with position information measured by the electron microscope to detect fluorescence information. A correlative light and electron microscopy (CLEM) method enables observation of a same position by electron microscopy and optical microscopy and observes localization of the phosphor. Further, PTL 1 discloses a method of detecting a decrease in the amount of light emitted from a phosphor damaged by electron beam irradiation and acquiring fluorescence information.

CITATION LIST

Patent Literature

PTL 1: JP-A-2006-145526

SUMMARY OF INVENTION

Technical Problem

Resolution of the electron microscope is essential to obtain sample information with nano spatial resolution for observation objects in nano-order such as the fluorescent viruses, the threading dislocations of the crystal defects, and the quantum dots. However, main sample information generally obtained by the electron microscope is limited to the surface shape and the information composition of the sample based on an amount of secondary electron emission. An object of the invention is to provide a charged particle beam apparatus capable of identifying a fluorescence wavelength.

In a CL method, which is one of methods for specifying the fluorescence wavelength, a phosphor that emits light by the electron beam irradiation must be selected. Further, since the CLEM method is a technique for superimposing an optical microscope image and an electron microscope image on an image, a problem on a resolution is not fundamentally solved. Further, in the method of PTL 1, in order to detect a decrease in the amount of light emitted from the phosphor, the sample must be damaged by the electron beam irradiation.

Solution to Problem

In an embodiment of the invention, a charged particle beam apparatus includes: an electromagnetic wave generation source configured to generate an electromagnetic wave with which a sample is irradiated; a charged particle optical system including a pulsing mechanism and configured to irradiate the sample with a focused charged particle beam; a detector configured to detect an emitted electron emitted by an interaction between the charged particle beam and the sample; a first irradiation control unit configured to control the electromagnetic wave generation source and irradiate the sample with a pulsed electromagnetic wave to generate an excited carrier; a second irradiation control unit configured to control the pulsing mechanism and irradiate an electromagnetic wave irradiation region of the sample with a pulsed charged particle beam; and a timing control unit. While the emitted electron is detected by the detector in synchronization with irradiation of the pulsed charged particle beam, the timing control unit is configured to control the first irradiation control unit and the second irradiation control unit, and control an interval time between the pulsed electromagnetic wave and the pulsed charged particle beam to the electromagnetic wave irradiation region.

Other problems and novel characteristics will become apparent from a description of the description and the accompanying drawings.

Advantageous Effect

Based on a transient change in the amount of emitted electrons, it is possible to detect the sample information with nano spatial resolution.

BRIEF DESCRIPTION OF DRAWINGS

FIG. 1 is a block diagram of a light-induced electron microscope.

FIG. 2 is a diagram for illustrating a multicolor-stained sample used as an observation sample.

FIG. 3 is a diagram illustrating a measurement principle.

FIG. 4 is a diagram illustrating the measurement principle.

FIG. 5 is a diagram illustrating an example of a time chart of an exciting pulse light and a pulsed electron beam.

FIG. 6 is a diagram illustrating an example of an analysis flow according to a first embodiment.

FIG. 7 is a diagram schematically illustrating a relationship between a change in an amount of secondary electron emission and a photoelectric interval time.

FIG. 8 is a diagram illustrating an example of a GUI for displaying settings of phosphor detection and an analysis result.

FIG. 9 is a diagram illustrating an example of a GUI for displaying a selection of a detection condition and a result.

FIG. 10 is a diagram illustrating an example of a GUI for displaying control settings according to the first embodiment.

FIG. 11A is a diagram illustrating an imaging method using the light-induced electron microscope.

FIG. 11B is a diagram illustrating the imaging method using the light-induced electron microscope.

FIG. 12 is a diagram illustrating an imaging method using the light-induced electron microscope.

FIG. 13 is a diagram for illustrating a killer defect detection method according to a second embodiment.

FIG. 14 is a diagram for illustrating a conversion efficiency evaluation method of a photoelectric conversion element according to a third embodiment.

DESCRIPTION OF EMBODIMENTS

In the present embodiment, it is possible to specify a fluorescence wavelength with nano spatial resolution from a transient change in an electron emission amount emitted from a sample. The inventors pay attention to a fact that a phosphor can be specified based on a carrier lifetime from a relationship between the fluorescence wavelength and the carrier lifetime. The sample is irradiated with an electromagnetic wave to generate excited carriers, and thereafter, the transient change in the electron emission amount, which decays as the excited carriers decrease (carrier lifetime), is probed with an electron beam. As a result, an observation with the nano spatial resolution can be performed by using an electron microscope. In the electron microscope that detects the transient change in the electron emission amount, an observation device that enables time resolution is required. In addition, in a case of specifying the phosphor, even if the transient change itself is not calculated, when an observation using a plurality of phosphors is performed, from a difference in the electron emission amount at a certain occasion, the phosphor can be specified based on a difference in the carrier lifetime of the phosphor.

In addition, what can generate the excited carriers may be selected as the electromagnetic wave according to an observation object. For example, X-rays, ultraviolet rays, visible rays, and infrared rays can be selected and used. Further, a phenomenon that causes generation of the excited carriers is not limited to those described in the embodiments described later, and may be a phenomenon such as dielectric polarization and dielectric relaxation.

In the embodiment described in detail below, unlike a CL method, it is only necessary to emit light by irradiation with the electromagnetic wave, for example, visible light or ultraviolet light, and the phosphor capable of being used so far in a fluorescence microscopy can be used as it is, and a choice of the phosphor is wide. Further, unlike a CLEM method, since positional information is acquired by the electron beam, the observation with the nano spatial resolution by the electron microscope can be implemented. Further, unlike PTL 1, the electron beam is intermittently emitted with low acceleration energy in consideration of effect of charging, so that an electron irradiation amount can be controlled, and damage to the sample caused by the electron beam can be reduced.

Hereinafter, embodiments of the invention will be described with reference to the drawings.

First Embodiment

FIG. 1 illustrates a block diagram of a light-induced electron microscope 1. The light-induced electron microscope 1 specifies a phosphor based on the carrier lifetime from a detected transient change in an amount of secondary electron emission.

Main components of the light-induced electron microscope 1 include an electron optical system, a light irradiation system, a stage mechanism system, a timing control system, an SEM control system, a signal analysis system, and an image processing system. The electron optical system includes an electron gun 2, a blanker 3, an aperture 4, a deflector 5, and an objective lens 6. As described later, the electron optical system is configured to irradiate a sample 7 with a pulsed electron beam. Therefore, deflection of the electron beam emitted from the electron gun 2 is turned on/off by the blanker 3 to turn on/off irradiation on the sample 7 with the electron beam. The electron beam is focused on a surface of the sample 7 by the objective lens 6, and is deflected by the deflector 5 to two-dimensionally scan an irradiation position of the electron beam on the sample 7. An SEM control unit 11 configuring the SEM control system sets optical conditions in the electron optical system. For example, in the SEM control unit 11, an electron gun control unit 12 controls an acceleration voltage of the electron beam and the amount of irradiation current. The SEM control unit 11 is a control unit for the entire electron optical system, and also controls the deflector 5, the objective lens 6, and a control unit for each component of the electron optical system such as a condenser lens (not shown) according to the optical conditions.

The light irradiation system includes an exciting pulse light irradiation control unit 15 and an exciting pulse light source 16. As will be described later, the light-induced electron microscope 1 synchronizes an exciting pulse light emitted from the exciting pulse light source 16 and the pulsed electron beam emitted from the electron optical system, and irradiates the sample 7 therewith. The timing control system for this is configured with a timing control unit 13, a blanking control unit 14, and the exciting pulse light irradiation control unit 15. The timing control unit 13 including a master clock controls these irradiation timings according to an irradiation timing condition set from an operation interface 18. In this embodiment, the blanker 3 and the blanking control unit 14 are used for irradiation with the pulsed electron beam, but the invention is not limited thereto. The pulsed electron beam may be emitted directly from a pulsed electron source, and the electron beam may be pulsed by a mechanical/electrical chopping mechanism. A pulsed electron beam irradiation control unit corresponding to a pulsing mechanism that generates the pulsed electron beam is provided, and the pulse electron beam irradiation control unit may be configured to be controlled by the timing control unit 13.

A stage mechanism system includes a stage 9 capable of tilt control in XYZ axes and a sample table 8 on the stage 9. The sample 7 is placed on the sample table 8.

The signal analysis system includes a secondary electron detection unit 17 that detects the amount of the secondary electrons detected by a detector 10 that detects secondary electrons emitted by an interaction between the emitted electron beam and the sample 7, a carrier lifetime calculation unit 19, and a phosphor specifying unit 20. Details of the carrier lifetime calculation unit 19 and the phosphor specifying unit 20 will be described later. In this embodiment, the secondary electrons are detected as emitted electrons.

The image processing system includes an image forming unit 21 and an image display unit 22. In the image forming unit 21, an electron microscope image (SEM image) is formed based on the secondary electrons detected by the detector 10, and displayed by the image display unit 22 on a monitor. In the image forming unit 21, a normal two-dimensional scan (referred to as TV scan) is performed on the sample with the electron beam, so that the SEM image can be formed based on the secondary electrons detected by the detector 10, and the SEM image can also be formed by two-dimensional scanning using the pulsed electron beam. A method of forming the SEM image based on the secondary electrons detected by the detector 10 by two-dimensionally scanning with the pulsed electron beam will be described later.

FIG. 2 shows, as an example of the observation sample in the first embodiment, a fluorescence-stained sample 27 in which a function of cell tissue 23 is multicolor-stained with phosphors having different fluorescence wavelengths. Fluorescent viruses (hereinafter, abbreviated as phosphor) 24, 25, 26 have different unique fluorescent wavelengths. By utilizing permeability of the fluorescent viruses, the function of the cell tissue (for example, nucleus, mitochondria, or the like) can be respectively multicolor-stained with the phosphors having different fluorescence wavelengths.

A measurement principle will be described with reference to FIGS. 3 and 4. When the fluorescence-stained sample 27 is irradiated with exciting pulse light 28, electrons are transited from a ground state (VB) to an excited state (CB), and a large number of photo-excited carriers are generated. At that time, an interval of any photoelectric interval time Ti(n) 30 specified by the operation interface 18 is provided for the exciting pulse light 28, and secondary electrons emitted from the sample by irradiation with a pulsed electron beam 29 are detected by the detector 10. FIG. 3 illustrates a case where the photoelectric interval time Ti(n) 30 is Ti(0), and a large number of photo-excited carriers exist in the excited state CB. In this state, the amount of secondary electron emission emitted from the sample 7 is large, so that the intensity of a secondary electron detection signal increases. Here, the electrons that are transited to the excited state CB emit fluorescent light 31 and lose energy, so that a phenomenon of relaxation to the ground state VB occurs. FIG. 4 illustrates a case where the photoelectric interval time Ti(n) 30 is Ti(1) (Ti(1)>Ti(0)), and a large number of photo-excited carriers are relaxed to the ground state VB. In this state, the intensity of the secondary electron signal intensity becomes weak. That is, while the photo-excited carriers are transited to the excited state CB and emit the fluorescent light 31, the intensity of the secondary electron detection signal is strong. Further, since the intensity of the secondary electron detection signal decreases in accordance with a magnitude of the carrier lifetime, the degree of decrease in the intensity of the secondary electron detection signal on a time axis differs for each phosphor.

FIG. 5 illustrates an example of a time chart of the exciting pulse light 28 and the pulsed electron beam 29. The timing control unit 13 controls the exciting pulse light irradiation control unit 15 and the blanking control unit 14 by a master clock 32 ticked by a clock signal. As the photoelectric interval time Ti(n) 30 becomes longer, the carrier is relaxed, and the amount of secondary electron emission obtained by the detector 10 decreases with such an effect. Detection timing of the detector 10 is synchronized with the pulsed electron beam 29, and sampling is performed at a constant timing regardless of the photoelectric interval time Ti(n).

Here, the photoelectric interval time Ti(n) between the excitation pulse light 28 and the pulsed electron beam 29 specified from the operation interface 18 is electrically controlled by the timing control unit 13, but by providing a stage mechanism capable of adjusting an optical distance between the exciting pulse light source 16 and the sample 7, delay time can be adjusted by adjusting an optical path length.

FIG. 6 illustrates an example of an analysis flow according to the present embodiment. In the present embodiment, measurement and analysis for specifying a phosphor in a sample will be described as an example. First, the irradiation position is determined (S1), and the determined irradiation position is irradiated with the exciting pulse light (S2). Next, the predetermined photoelectric interval time Ti(n) is counted to provide a delay interval (S3), and the irradiation position of the exciting pulse light is irradiated with the pulsed electron beam (S4). The secondary electrons emitted by the irradiation with the pulsed electron beam are detected by the detector 10 (S5). Operations of S2 to S5 are repeated while the photoelectric interval time Ti(n) is changed. Dependency of an obtained change in the amount of secondary electron emission on the photoelectric interval time Ti(n) is analyzed (S6), and the carrier lifetime is calculated based on an analysis result (S7). Finally, a phosphor is specified based on the calculated carrier lifetime (S8).

FIG. 7 schematically illustrates an example of the dependence of the change in the amount of secondary electron emission on the photoelectric interval time Ti(n). FIG. 7 is an observation example of a fluorescence-stained sample using three types of phosphors each having a unique carrier lifetime described in FIG. 2. As time elapses from the irradiation with the exciting pulse light, the amount of secondary electron emission decays according to each carrier lifetime of the phosphor. A graph 71 illustrates transition of the amount of secondary electron emission according to the photoelectric interval time Ti(n) for each phosphor. Further, SEM images acquired at photoelectric interval times (a), (b), (c), and (d) illustrated in the graph 71 are illustrated as an image 33. The SEM image is an image having a brightness contrast according to the amount of secondary electron emission detected by the detector 10.

When an image 33-2 acquired at the timing (b) is subtracted from an image 33-1 acquired at the timing (a), a signal of a stained portion of a phosphor 34 of a first color remains. This is because, as illustrated in the graph 71, the amount of secondary electron emission of a phosphor 35 and a phosphor 36 hardly changes during the photoelectric interval time (a) and (b), but an amount of secondary electron emission of the phosphor 34 is decreased. Thereby, a position and type of the phosphor 34 having a short carrier lifetime as the first color can be specified. Similarly, by subtracting an image 33-3 acquired at the timing (c) from the image 33-2 acquired at the timing (b), the phosphor 35 as a second color can be specified. This is because, as illustrated in the graph 71, the amount of secondary electron emission of the phosphor 36 hardly change during the photoelectric interval time (b) and (c), but an amount of secondary electron emission of the phosphor 35 is decreased. Further, by subtracting an image 33-4 acquired at the timing (d) from the image 33-3 acquired at the timing (c), the phosphor 36 as a third color can be specified. This is because, as illustrated in the graph 71, the amount of secondary electron emission of the phosphor 36 decreases during the photoelectric interval time (c) and (d).

FIG. 8 illustrates an example of a graphic user interface (GUI) for displaying settings of phosphor detection and the analysis result illustrated in FIG. 7. When a detection setting of the operation interface 18 is selected, the GUI illustrated in FIG. 8 is displayed on a monitor. A window 37 is an image display unit on which an SEM image firstly acquired at Ti(0)

is displayed. A window 38 is used to input information on the phosphors used for staining the sample. The number of types 81 of used phosphors is inputted, and phosphors (model 82) corresponding to the number of types 81 can be selected from a phosphor list stored in advance. An analysis result is displayed in a window 39. The type of the used phosphor and a transient change in the amount of secondary electron emission are displayed in a graph, and a carrier lifetime of each phosphor is calculated. The information on the phosphor specified from the calculated carrier lifetime is reflected in the window 37, and, for example, a marker indicating the type of the phosphor or a fluorescent wavelength color may be superimposed and displayed on the image of the window 37.

Then, FIG. 9 illustrates an example of a GUI for displaying a selection of a detection condition and a result. When a setting of the detection condition of the operation interface 18 is selected, the GUI illustrated in FIG. 9 is displayed on the monitor. In this GUI, since the amount of secondary electron emission of the phosphor is decayed according to each carrier lifetime, the detection condition in which contrast between stained regions in a fluorescence-stained sample using a plurality of phosphors appears most strongly, specifically, the photoelectric interval time is determined.

In a window 40, a marker for setting the detection condition is set. Markers for the types of the phosphors used for staining the sample are set. As in FIG. 8, a phosphor (model) corresponding to the number of markers can be selected from a phosphor list stored in advance. A window 41 is an image display unit on which an SEM image is displayed. First, an SEM image 91 of the sample is obtained and displayed in a window 41a. This image may be an SEM image obtained by a general TV scan without using the pulsed electron beam. A position at which signal intensity is detected is selected by aligning the marker on the SEM image 91 (markers 1 to 3 in the SEM image 91). This position at which the signal intensity is detected is a representative position stained by each of a plurality of staining materials. A window 42 displays a detection result. In this example, magnitude of an electric signal from the detector 10 at the position selected by each marker is measured while the photoelectric interval time is changed. That is, no image is formed as illustrated in FIG. 7. The detector 10 outputs a voltage or a current according to the amount of the detected secondary electrons. The electrical signal may be either the voltage or the current output from the detector 10. In the example of the detection result of FIG. 9, when the photoelectric interval time is set to 50 ns, a difference between the electric signals of the three markers is the largest.

Thus, a window 41b displays an SEM image 93 obtained by irradiation with the pulsed electron beam when the photoelectric interval time is set to 50 ns ((c)). In the setting of this detection condition, since the magnitude of the electric signal is only acquired at the set marker position without creating an image at each photoelectric interval time, measurement time can be shortened and charging of the sample can be prevented.

In the above description, for discriminating the phosphor, a method of utilizing a fact that the amount of secondary electron emission of the phosphor decays according to the carrier lifetime is described, but it is also possible to discriminate the phosphor by using a fact that magnitude of amplification effect differs depending on light absorption intensity of the phosphor itself. For example, when there is a difference in the amount of secondary electron emissions of the phosphors when the photoelectric interval time is 0 ns, it is possible to discriminate the phosphor without adjusting the photoelectric interval time.

Then, FIG. 10 illustrates an example of a GUI for displaying a control setting according to the present embodiment. When a control setting of the operation interface 18 is selected, the GUI of FIG. 10 is displayed on the monitor. In a window 43, it is possible to select whether to irradiate the sample with the exciting pulse light. When the irradiation with the exciting pulse light is performed, the photoelectric interval time Ti(n) is input. Further, whether to form an image can be selected. When an image is formed, the number of pixel splits, the number of integrated frames, and a size of the image to be displayed are input.

The method of forming an SEM image when the irradiation with the pulsed electron beam is performed will be described with reference to FIGS. 11A and 11B. A plurality of memories are provided in the image forming unit 21, and signals from the secondary electron detection unit 17 are selectively written into the plurality of memories. Photographing conditions are set by a user through a system or the GUI as illustrated in FIG. 10. Specifically, a pulse width of the pulse electron beam, the photoelectric interval time Ti(n), the detection timing, the number of times of frame integration, and an interval time between the frame integration are set. The pulse width of the pulsed electron beam is set to an irradiation condition in which charging under irradiation with the pulsed electron beam hardly affects a secondary electron signal. The photoelectric interval time Ti(n) 30 is an interval between the exciting pulse light 28 and the pulsed electron beam 29, and in order to perform the detection illustrated in FIG. 7, it is necessary to provide a plurality of photoelectric interval times Ti(n) for one exciting pulse light. Alternatively, when an SEM image is acquired by setting an optimal photoelectric interval time Ti(n) according to FIG. 9, an SEM image with an appropriate period of photoelectric interval time may be acquired. The detection timings of the detector 10 are the same for all the photoelectric interval times Ti(n).

As illustrated in FIG. 11A, compared with irradiation with the exciting pulse light being performed once in one cycle, a plurality of (in this example, n=1 to 3) photoelectric interval times Ti(n) are provided, and irradiation with the pulsed electron beam is performed. The irradiation with the pulsed electron beam is performed on a scan region 61 with n pixels in a pixel direction (X direction) and m lines in a line direction (Y direction). Sizes of n and m are determined according to a set size of the image. For deflection in the pixel direction (X direction), pixel positions 1 to n are scanned with a sawtooth-wave-shaped voltage 48, and for deflection in the line direction (Y direction), the same voltage is applied on the same line. When the electron beam is moved between lines, a region 49 from which no data is acquired is provided to prevent fluctuation of the electron beam. When scanning of the m lines is completed, scanning of a first frame is completed, the process returns to a line 1 again, and scanning of a second frame is started.

Irradiation timing of the pulsed electron beam and the deflection in the pixel direction (X direction) are synchronized such that the position irradiated with the pulsed electron beam moves by one pixel, and the photoelectric interval time Ti(n) is set such that this synchronization is established. As illustrated in FIG. 11B, the signals from the secondary electron detection unit 17 acquired at the photoelectric interval time Ti(n) (n=1 to 3 in this example) in each cycle are stored in the memory n. That is, in the first frame and the first cycle, the entire sample is irradiated with a first excited light, the pixel position 1 is irradiated with the pulse electron beam at the timing of Ti(1), and the detection signal is stored in the memory 1. Subsequently, the pixel position 2 is irradiated with the pulse electron beam at the timing of Ti(2), the detection signal is stored in the memory 2, and the pixel position 3 is irradiated with the pulse electron beam at the timing of Ti(3), the detection signal is stored in the memory 3. By repeating this process, when scanning up to the third frame is completed, one SEM image (frame image) is formed for each Ti(n) from data stored in each of the memories 1 to n. When the number of integrated frames is specified, the frame images of a specified number of times are acquired, and the acquired images are added up cumulatively and displayed as the SEM images. As described above, the number of times of the irradiation with the exciting pulse light is small, and measurement can be performed with less damage to a measurement sample.

In FIGS. 11A and 11B, adjacent pixel positions are irradiated with the pulsed electron beam. In FIG. 12, the number of pixel splits is set, and a position spaced apart by pixels corresponding to the number of pixel splits from a position where irradiation with the pulsed electron beam is performed earlier is irradiated with a next pulsed electron beam, so that influence of irradiation history near signal acquisition can be avoided. For simplicity of explanation, a waveform in FIG. 12 illustrates only the pulsed electron beam applied during the photoelectric interval of Ti(1) from the irradiation with the exciting pulse light, but similar to FIGS. 11A and 11B, the invention is also applicable to a case where a pulsed electron beam is applied at the plurality of photoelectric interval times Ti(n) in one cycle, and parts different from FIGS. 11A and 11B will be mainly described. When the pulsed electron beam is applied at the plurality of photoelectric interval times Ti(n), pixel positions where signals are acquired at the timing of the photoelectric interval time Ti(n) (n=1 to 3) as illustrated in the scan region 62 are spaced apart by pixels corresponding to the number of pixel splits.

In the example of FIG. 12, when the scanning in the pixel direction (X direction) is completed, the scanning in the pixel direction (X direction) is started at a position 63 with a predetermined pixel interval also in the line direction (Y direction). The scanning is repeated, and when the scanning in all lines is completed, signals in one row of the scan region 62 (for example, a row 64) are prepared. Scanning of the scan region 62 is started again, but at this time, by shifting a phase of the scanning in the pixel direction (X direction), an irradiation position different from the irradiation position of the pulse electron beam in the previous scanning is irradiated with the pulse electron beam. By repeating this, a frame image is formed. In this example, although the number of times of scanning in the scan region is larger than that in FIGS. 11A and 11B, by separating the irradiation position of the pulsed electrons, influence of surrounding charging can be avoided, and an SEM image having a more accurate potential contrast can be formed.

As a result, in the first embodiment, the phosphor can be specified based on the detected carrier lifetime from the transient change in the amount of secondary electron emission.

Second Embodiment

In the second embodiment, a method of inspecting a stacking fault in a semiconductor and detecting a killer defect will be described. A configuration example of the light-induced electron microscope in the present embodiment is similar to that illustrated in FIG. 1, and the observation sample is a semiconductor having a stacking fault locally in a wide gap substrate. FIG. 13 illustrates band diagrams of two kinds of stacking faults (defect type 1 and defect type 2) having different defect levels and electron microscope images (schematic diagram) of a sample observed with different photoelectric interval times Ti. In the present embodiment, after irradiating a semiconductor sample with an exciting pulse light with an appropriate wavelength, the sample is irradiated with a pulsed electron beam at any photoelectric interval time Ti(n), so that a transient change in an amount of secondary electron emission emitted from stacking fault locations is acquired. An electron microscope image 44a is an image acquired at the photoelectric interval time Ti(0), an electron microscope image 44b is an image acquired at the photoelectric interval time Ti(1) (Ti(1)>Ti(0)), and stacking faults 45 observed in each image are schematically illustrated.

In apart where the wide gap substrate has no stacking fault, the amount of the excited carriers is small and the amount of secondary electron emission is small, so that the potential contrast is low. On the other hand, in the stacking fault 45, the amount of the excited carriers is large due to impurity level, and the amount of secondary electron emission is increased, so that the potential contrast is high. Therefore, the stacking faults included in the wide gap substrate are observed with high contrast in the electron microscope image 44a acquired with the relatively short photoelectric interval time Ti(0).

Here, in the stacking fault of the defect type 1, the time for the carrier to escape from a trap is long, and the carrier remains in the excited state for a long time. In contrast, in the stacking fault of the defect type 2, the time for the carrier to escape from a trap is short, and the carrier is relaxed to the ground state early. Therefore, in the electron microscope image 44b acquired with the photoelectric interval time Ti(1), among the stacking faults observed at the photoelectric interval time Ti(0), contrast of some stacking faults is lost. That is, at the photoelectric interval time Ti(1), the stacking faults of the defect type 1 (killer defect) are still observed with high contrast, but the contrast of the stacking fault of the defect type 2 is lost, so that a contrast corresponding to the carrier lifetime of the stacking fault is obtained. Thus, by setting the photoelectric interval time Ti(n) as a device performance evaluation index and performing the observation the second embodiment, identification of the stacking fault locations and whether the stacking fault is a killer defect that degrades device performance can be determined.

As a result, according to the second embodiment, it is possible to adjust coordinates of a crystal defect in a semiconductor with high spatial resolution, and by determining whether the crystal defect at each location is a killer defect causing a decrease in the device performance based on the detected carrier lifetime, quality improvement, non-uniformity and the performance evaluation of the semiconductor can be achieved.

Third Embodiment

In the third embodiment, a method for evaluating conversion efficiency of a photoelectric conversion element will be described. A configuration example of the light-induced electron microscope in the present embodiment is similar to that illustrated in FIG. 1, and the observation sample is a combinatorial sample of a quantum dot cell, which is one of photoelectric conversion materials known in solar cell research. In recent years, in research on the solar cells, quantum dot structures attract attention as the photoelectric conversion element that converts light irradiation energy into electric energy with high efficiency. In order to investigate the material and composition of the quantum dots with excellent photoelectric conversion properties, the combinatorial sample is a sample in which an extremely large number of the quantum dot cells made of various compositions are formed on one substrate. FIG. 14 illustrates band diagrams of quantum dot cells and electron microscope images (schematic diagram) of a combinatorial sample in which quantum dot cells 46 produced with various compositions (a to i) are arranged. In the present embodiment, after irradiating the sample with light according to a wavelength of sunlight, a transient change in the amount of secondary electron emission emitted by irradiating the sample with a pulsed electron beam at any photoelectric interval time Ti(n) is acquired.

As illustrated in FIG. 14, although an energy level differs depending on the material and composition of the quantum dots, the photo-excited carriers are generated by irradiating the quantum dot cells 46 with light. An electron microscope image 47a is an image acquired at the photoelectric interval time Ti(0) immediately after photoexcitation, an electron microscope image 47b is an image acquired at the photoelectric interval time Ti(1) (Ti(1)>Ti(0)), and the quantum dot cells 46 observed in each image are schematically illustrated. In Ti(0) immediately after photoexcitation, the amount of secondary electron emission is large and potential contrast is high in any of the quantum dot cells 46 due to presence of the photo-excited carriers. However, when the amount of secondary electron emission is detected by irradiation with the pulsed electron beam with a delay of the photoelectric interval time Ti(1) from the light irradiation, as illustrated in the electron microscope image 47b, a difference occurs in the potential contrast of the quantum dot cells. In a low-efficiency quantum dot cell, the carriers are relaxed to a direct valence band and the carrier lifetime is short, while in a high-efficiency quantum dot cell, the excited carriers are induced again by energy released during the relaxation, so that the carrier lifetime becomes longer. For this reason, at the time of the photoelectric interval time Ti(1), as the quantum dot cell becomes high-efficiency, the amount of secondary electron emission increases, and a higher potential contrast appears. As described above, a quantum dot cell that can be observed with the high contrast even at the time of the photoelectric interval time Ti(1) can be evaluated as having high efficiency as the photoelectric conversion element.

Although illustrated schematically in the drawing, an actual size of the quantum dot is several nanometers. Therefore, according to the third embodiment, it is possible to evaluate the efficiency of the photoelectric conversion element including the quantum dot structure with nano spatial resolution, and to observe, analyze, and evaluate a selection of an appropriate material and a composition ratio at a time.

While the invention made by the present inventors has been specifically described based on the embodiments, the invention is not limited to the embodiments described above, and various changes and modifications may be made without departing from the scope of the invention. For example, in the embodiments, the scanning electron microscope is described as an example, but a transmission electron microscope or a focused ion beam (FIB) device using an ion beam as a charged particle beam may be used.

DESCRIPTION OF REFERENCE NUMERALS

1: light-induced electron microscope, 2: electron gun 3: blanker, 4: aperture, 5: deflector, 6: objective lens, 7: sample, 8: sample table, 9: stage in XYZ axes, 10: detector, 11: SEM control unit, 12: electron gun control unit, 13: timing control unit, 14: blanking control unit, 15: exciting pulse light irradiation control unit, 16: exciting pulse light source, 17: secondary electron detection unit, 18: operation interface, 19: carrier lifetime calculation unit, 20: phosphor specifying unit, 21: image forming unit, 22: image display unit.

The invention claimed is:

1. A charged particle beam apparatus, comprising:
an electromagnetic wave generation source configured to generate an electromagnetic wave with which a sample is irradiated;
a charged particle optical system including a pulsing mechanism and configured to irradiate the sample with a focused charged particle beam;
a detector configured to detect an emitted electron emitted by an interaction between the charged particle beam and the sample;
a first irradiation control unit configured to control the electromagnetic wave generation source and irradiate the sample with a pulsed electromagnetic wave to generate an excited carrier;
a second irradiation control unit configured to control the pulsing mechanism and irradiate an electromagnetic wave irradiation region of the sample with a pulsed charged particle beam; and
a timing control unit, wherein
while the emitted electron is detected by the detector in synchronization with irradiation of the pulsed charged particle beam, the timing control unit is configured to control the first irradiation control unit and the second irradiation control unit, and control an interval time between the pulsed electromagnetic wave and the pulsed charged particle beam to the electromagnetic wave irradiation region,
the timing control unit is configured to control the first irradiation control unit and the second irradiation control unit to perform the irradiation with the pulsed charged particle beam a plurality of times for one irradiation with the pulsed electromagnetic wave,
the sample is a sample stained with a plurality of phosphors each having a unique fluorescence wavelength,
the charged particle beam apparatus further includes a signal analysis system configured to analyze a signal from the detector, and
the signal analysis system is configured to obtain a change in an electron emission amount detected by the detector with respect to the interval time, and specify the phosphor based on a carrier lifetime of the phosphor.

2. The charged particle beam apparatus according to claim 1, further comprising:
an image processing system configured to form an image from a signal from the detector and display the image, wherein
the timing control unit is configured to control the first irradiation control unit and the second irradiation control unit to perform irradiation with a first pulsed charged particle beam at a first interval time from the irradiation with the pulsed electromagnetic wave, and perform irradiation with a second pulsed charged particle beam at a second interval time, which is different from the first interval time, from the irradiation with the pulsed electromagnetic wave, and
the image processing system is configured to form a first image based on the irradiation with the first pulsed charged particle beam and a second image based on the irradiation with the second pulsed charged particle beam.

3. The charged particle beam apparatus according to claim 2, wherein
an irradiation position of the second pulsed charged particle beam is a position separated by a plurality of pixels from an irradiation position of the first pulsed charged particle beam.

4. The charged particle beam apparatus according to claim 1, wherein
the timing control unit is configured to control the first irradiation control unit and the second irradiation control unit to perform the irradiation with the pulsed charged particle beam once for one irradiation with the pulsed electromagnetic wave, and
an irradiation position of the pulsed charged particle beam is a position separated by a plurality of pixels from an irradiation position of a previous pulsed charged particle beam.

5. The charged particle beam apparatus according to claim 1, wherein
the electromagnetic wave is selected from X-ray, ultraviolet light, visible light, and infrared light.

6. A sample observation method for observing a sample using a charged particle beam apparatus, the method comprising:
irradiating the sample with a pulsed electromagnetic wave;
irradiating an irradiation region of the pulsed electromagnetic wave with a pulsed charged particle beam a plurality of times at a different interval time for one irradiation with the pulsed electromagnetic wave;
detecting an emitted electron emitted by an interaction between the pulsed charged particle beam and the sample in synchronization with the irradiation of the pulsed charged particle beam; and
obtaining a change in an electron emission amount of the detected emitted electron with respect to the interval time, wherein
the sample is a sample stained with a phosphor, and
from the change in the electron emission amount with respect to the interval time, the phosphor is specified based on a carrier lifetime of the phosphor.

7. The sample observation method according to claim 6, wherein
the sample is a sample stained with a plurality of phosphors, and
the method further includes:
forming a plurality of images based on the emitted electrons detected in synchronization with each of the plurality of pulsed charged particle beams at different interval time; and
from the change in contrast in the plurality of images according to the change in the interval time, specifying a position where each of the plurality of phosphors is stained.

8. The sample observation method according to claim 6, wherein
the sample is a sample stained with a plurality of phosphors, and
the method further includes:
specifying a position where each of the plurality of phosphors is stained and specifying an interval time during which a difference in the electron emission amount of the emitted electrons detected at the position becomes large; and
forming an image based on the emitted electrons detected in synchronization with the pulsed charged particle beams at the specified interval time.

9. A sample observation method for observing a sample using a charged particle beam apparatus, the method comprising:
irradiating the sample with a pulsed electromagnetic wave;
irradiating an irradiation region of the pulsed electromagnetic wave with a pulsed charged particle beam a plurality of times at a different interval time for one irradiation with the pulsed electromagnetic wave;
detecting an emitted electron emitted by an interaction between the pulsed charged particle beam and the sample in synchronization with the irradiation of the pulsed charged particle beam; and
obtaining a change in an electron emission amount of the detected emitted electron with respect to the interval time,
wherein
the sample is a wide gap semiconductor substrate, and
whether a stacking fault is a killer defect is determined based on a change in the electron emission amount emitted from a position of a stacking fault of the wide gap semiconductor substrate with respect to the interval time.

10. A sample observation method for observing a sample using a charged particle beam apparatus, the method comprising:
irradiating the sample with a pulsed electromagnetic wave;
irradiating an irradiation region of the pulsed electromagnetic wave with a pulsed charged particle beam a plurality of times at a different interval time for one irradiation with the pulsed electromagnetic wave;
detecting an emitted electron emitted by an interaction between the pulsed charged particle beam and the sample in synchronization with the irradiation of the pulsed charged particle beam; and
obtaining a change in an electron emission amount of the detected emitted electron with respect to the interval time,
wherein
the sample is a combinatorial sample in which a plurality of quantum dot cells each having a different material or composition are formed on one substrate as a photoelectric conversion element, and
efficiency of each said quantum dot cell is evaluated based on a change in the electron emission amount emitted from each said quantum dot cell with respect to the interval time.

11. The sample observation method according to claim 6, wherein
the pulsed electromagnetic wave is selected from X-ray, ultraviolet light, visible light, and infrared light.

* * * * *